(12) United States Patent
Kondo et al.

(10) Patent No.: US 10,095,152 B2
(45) Date of Patent: Oct. 9, 2018

(54) LIGHT EMITTING ELEMENT ARRAY, OPTICAL DEVICE, AND IMAGE FORMING APPARATUS

(71) Applicant: FUJI XEROX CO., LTD., Tokyo (JP)

(72) Inventors: Takashi Kondo, Kanagawa (JP); Junichiro Hayakawa, Kanagawa (JP); Naoki Jogan, Kanagawa (JP); Akemi Murakami, Kanagawa (JP); Jun Sakurai, Kanagawa (JP)

(73) Assignee: FUJI XEROX CO., LTD., Minato-ku, Tokyo (JP)

( * ) Notice: Subject to any disclaimer, the term of this patent is extended or adjusted under 35 U.S.C. 154(b) by 48 days.

(21) Appl. No.: 15/487,788

(22) Filed: Apr. 14, 2017

(65) Prior Publication Data
US 2018/0059586 A1 Mar. 1, 2018

(30) Foreign Application Priority Data
Aug. 25, 2016 (JP) .................................. 2016-165153

(51) Int. Cl.
| | |
|---|---|
| *G03G 15/04* | (2006.01) |
| *H01S 5/125* | (2006.01) |
| *H01S 5/183* | (2006.01) |
| *H01S 5/343* | (2006.01) |
| *H01S 5/50* | (2006.01) |

(52) U.S. Cl.
CPC ....... *G03G 15/04072* (2013.01); *H01S 5/125* (2013.01); *H01S 5/183* (2013.01); *H01S 5/34353* (2013.01); *H01S 5/50* (2013.01)

(58) Field of Classification Search
None
See application file for complete search history.

(56) References Cited

U.S. PATENT DOCUMENTS

| | | | |
|---|---|---|---|
| 7,873,082 B2 * | 1/2011 | Takabayashi | B82Y 20/00 372/20 |
| 2014/0126941 A1 | 5/2014 | Ueno et al. | |
| 2018/0090576 A1 * | 3/2018 | Kim | H01S 5/026 |

FOREIGN PATENT DOCUMENTS

JP 2014-095778 A 5/2014

* cited by examiner

*Primary Examiner* — Billy Lactaoen
(74) *Attorney, Agent, or Firm* — Sughrue Mion, PLLC

(57) ABSTRACT

A light emitting element array includes plural semiconductor stacked structures each including a light emitting unit that is formed on a substrate, and a light amplification unit that extends from the light emitting unit along a substrate surface of the substrate to have a length in an extension direction which is longer than that of the light emitting unit, amplifies light propagating in the extension direction from the light emitting unit, and emits the amplified light from a light emission portion formed along the extension direction, wherein the plural semiconductor stacked structures are arranged such that the extension directions of the respective light amplification units are substantially parallel to each other.

9 Claims, 10 Drawing Sheets

LIGHT EMITTING ELEMENT ARRAY, OPTICAL DEVICE, AND IMAGE FORMING APPARATUS

CROSS-REFERENCE TO RELATED APPLICATIONS

This application is based on and claims priority under 35 USC 119 from Japanese Patent Application No. 2016-165153 filed Aug. 25, 2016.

BACKGROUND

Technical Field

The present invention relates to a light emitting element array, an optical device, and an image forming apparatus.

SUMMARY

According to an aspect of the invention, a light emitting element array includes
plural semiconductor stacked structures each including
a light emitting unit that is formed on a substrate, and
a light amplification unit that
extends from the light emitting unit along a substrate surface of the substrate to have a length in an extension direction which is longer than that of the light emitting unit,
amplifies light propagating in the extension direction from the light emitting unit, and
emits the amplified light from a light emission portion formed along the extension direction,
wherein the plural semiconductor stacked structures are arranged such that the extension directions of the respective light amplification units are substantially parallel to each other.

BRIEF DESCRIPTION OF THE DRAWINGS

Exemplary embodiments of the present invention will be described in detail based on the following figures, wherein.

DETAILED DESCRIPTION

Hereinafter, exemplary embodiments of the present invention will be described in detail with reference to the drawings.

First Exemplary Embodiment

Figure 1A:
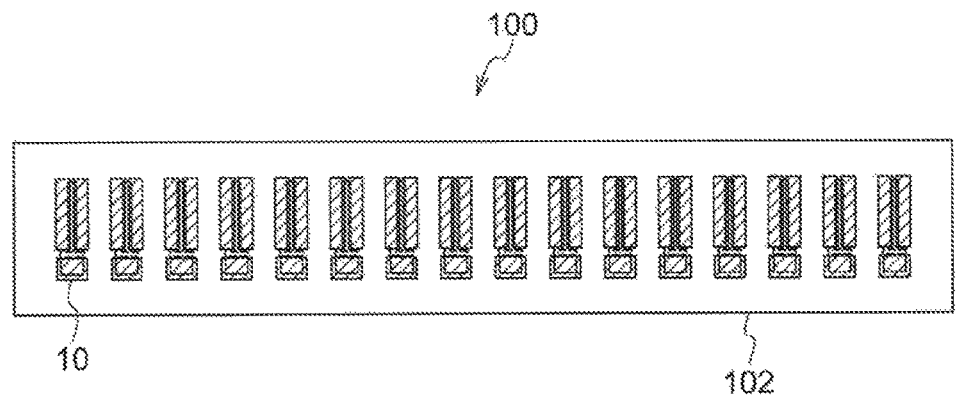
FIGS. 1A and 1B are top plan views illustrating exemplary configurations of a light emitting element array and a light emitting element according to a first exemplary embodiment, respectively.

A light emitting element array according to the present exemplary embodiment will be described with reference to FIGS. 1A to 6B. FIG. 1A illustrates a top plan view of a light emitting element array 100 according to the present exemplary embodiment, and FIG. 1B illustrates a top plan view of a single light emitting element 10 that constitutes the light emitting element array 100.

As illustrated in FIG. 1A, the light emitting element array 100 according to the present exemplary embodiment includes plural (sixteen in FIG. 1A) light emitting elements 10 formed on a substrate 102 of a semiconductor. As an example, the light emitting element array 100 according to the present exemplary embodiment is configured by forming plural GaAs-based light emitting elements 10 on the substrate 102 of GaAs. In the light emitting element array 100 according to the present exemplary embodiment, the respective light emitting elements 10 are arranged in parallel in a state where the end portions thereof are aligned. However, the arrangement form of the respective light emitting elements 10 is not limited thereto, and the end portions may be arranged to be dislocated. In addition, the respective light emitting elements 10 do not necessarily have to be arranged in parallel, and the respective light emitting elements 10 may be arranged to be inclined to each other such that an acceptable range of an angle between the respective light emitting elements 10 is, for example, within ±20° (approximately in parallel). Further, the smaller the acceptable range of the angle is, the easier the light emitted from the respective light emitting elements 10 is linearly condensed, and as a result, for example, the acceptable range of the angle may be within ±5°.

Figure 1B:
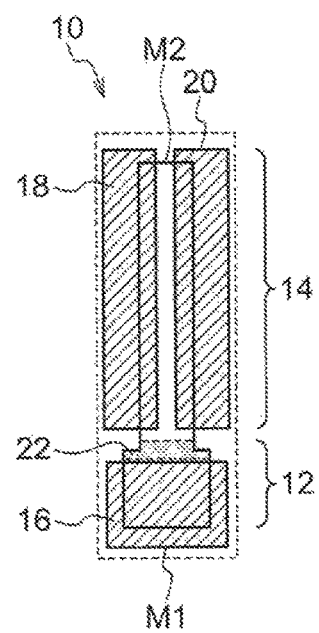

As illustrated in FIG. 1B, the light emitting element 10 according to the present exemplary embodiment includes a light emitting unit 12 and a light amplification unit 14. The light emitting element 10 has two mesas M1 and M2 (a semiconductor stacked structure) on the substrate 102, in which the mesa M1 constitutes the light emitting unit 12 and the mesa M2 constitutes the light amplification unit 14. The light emitting unit 12 serves to generate emission light emitted from the light emitting element 10, and in the present exemplary embodiment, as an example, the light emitting unit 12 is configured with a GaAs-based surface emitting semiconductor laser (vertical cavity surface emitting laser (VCSEL)). The light amplification unit 14 serves to amplify the light generated by the light emitting unit 12 and emit the amplified light, and in the present exemplary embodiment, as an example, the light amplification unit 14 is configured as a GaAs-based semiconductor optical amplifier (SOA). As illustrated in FIG. 1B, the light amplification unit 14 according to the present exemplary embodiment is formed in an elongated rectangular shape which is provided continuously from one side of the light emitting unit 12 having a substantially rectangular shape, and extends to the opposite side to the light emitting unit 12. Hereinafter, in some cases, a direction in which the light amplification unit 14 extends in an elongated manner is referred to as a "longitudinal direction" or an "extension direction" of the light emitting element 10, and a direction orthogonal to the "longitudinal direction" is referred to as a "transverse direction".

As illustrated in FIG. 1B, the light emitting unit 12 includes an electrode 16, and the light amplification unit 14 includes an electrode 18 and an electrode 20. Further, in the light emitting element 10 according to the present exemplary embodiment, a current blocking region 22 is provided between the light emitting unit 12 and the light amplification unit 14.

Figure 2A:
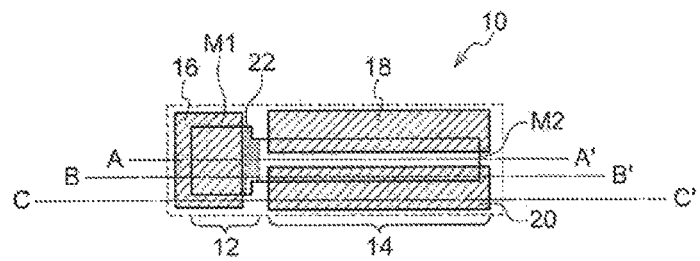
FIG. 2A is a top plan view illustrating an exemplary configuration of the light emitting element according to the first exemplary embodiment.

A cross-sectional structure of the light emitting element 10 will be described with reference to FIGS. 2A to 3C. FIG. 2A is a top plan view of the light emitting element 10 identical to that in FIG. 1B, FIG. 2B illustrates a cross-sectional view taken along line A-A' in FIG. 2A, FIG. 2C illustrates a cross-sectional view taken along line B-B' in FIG. 2A, and FIG. 2D illustrates a cross-sectional view taken along line C-C' in FIG. 2A.

Figure 2B:
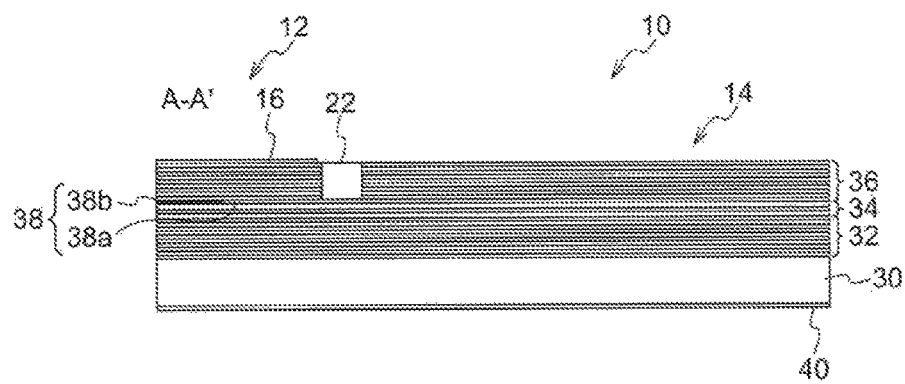
FIGS. 2B to 2D are cross-sectional views each illustrating an exemplary configuration of a portion of the light emitting element according to the first exemplary embodiment.
Figure 2C:
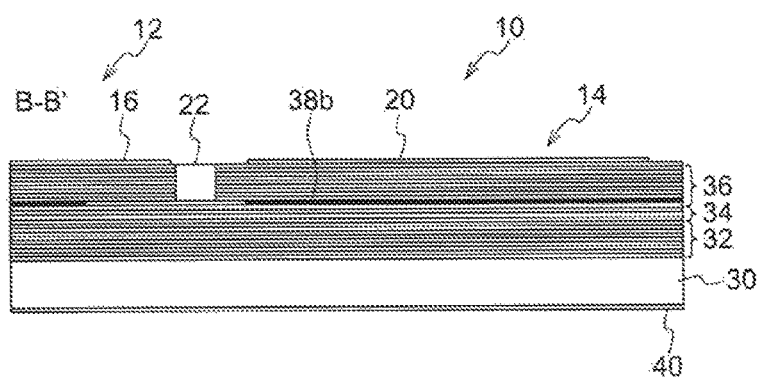
Figure 2D:
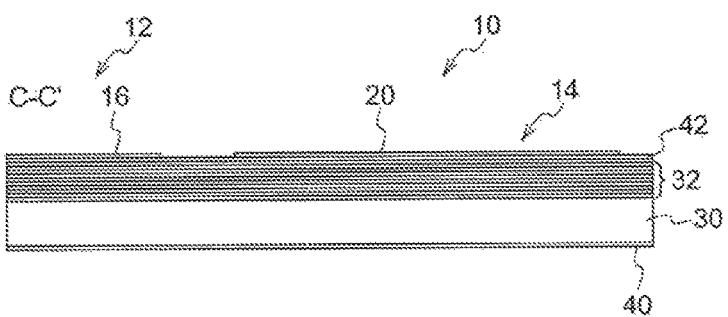

As illustrated in FIG. 2A, the line A-A' runs along approximately central portions of the mesas M1 and M2, and FIG. 2B is a cross-sectional view of a region including the mesas M1 and M2. As illustrated in FIG. 2B, the light emitting element 10 includes a lower DBR 32 formed on a substrate 30, an active region 34 formed on the lower DBR 32, and an upper DBR 36 formed on the active region 34. In addition, an oxide confinement layer 38 is formed on the upper DBR 36. As described above, the substrate 30 according to the present exemplary embodiment is a GaAs substrate.

In the present exemplary embodiment, the substrate 30 is an n-type GaAs substrate, and an n-side back electrode 40 is provided on the back surface of the substrate 30. Meanwhile, in the present exemplary embodiment, the lower DBR 32 is an n-type, and the upper DBR 36 is a p-type. Therefore, each of the electrodes 16, 18, and 20 are a p-side electrode. As described below, when the light emitting element 10 operates, the positive pole of a driving power source is applied to the electrodes 16, 18, and 20, the negative pole is applied to the back electrode 40, and a driving current is applied to the back electrode 40 from each of the electrodes 16, 18, and 20. However, the polarities of the substrate 30, the lower DBR 32, and the upper DBR 36 are not limited thereto, and the polarities may be reversed. That is, the substrate 30 may be a p-type GaAs substrate, the lower DBR 32 may be a p-type, and the upper DBR 36 may be an n-type.

The lower DBR 32 forms a pair with the upper DBR 36 to be described below, thereby constituting a resonator that contributes to the light emission of the light emitting element 10 (VCSEL). Assuming that an oscillation wavelength of the light emitting element 10 is λ and a refractive index of a medium (semiconductor layer) is n, the lower DBR 32 is a multilayer reflection mirror configured by repeatedly and alternately stacking two semiconductor layers having different refractive indexes and each having a film thickness of 0.25 λ/n. As a specific example, the lower DBR 32 is configured by repeatedly and alternately stacking an n-type low refractive index layer made of $Al_{0.90}Ga_{0.1}As$ and an n-type high refractive index layer made of $Al_{0.2}Ga_{0.8}As$.

For example, the active region 34 according to the present exemplary embodiment may include a lower spacer layer, a quantum well active layer, and an upper spacer layer (not illustrated). For example, the quantum well active layer according to the present exemplary embodiment may include four barrier layers made of $Al_{0.3}Ga_{0.7}As$ and three quantum well layers made of GaAs provided between the barrier layers. Further, the lower spacer layer and the upper spacer layer are disposed between the quantum well active layer and the lower DBR 32 and between the quantum well active layer and the upper DBR 36, respectively, and as a result, the lower spacer layer and the upper spacer layer serve to adjust a length of the resonator, and also serve as clad layers for confining a carrier.

The oxide confinement layer 38 provided on the active region 34 is a p-type current confinement layer, and includes a non-oxidized region 38a and an oxidized region 38b. The current, which flows from the p-side electrodes 16, 18, and 20 to the n-side back electrode 40, is throttled by the non-oxidized region 38a.

The upper DBR 36 is a multilayer reflection mirror configured by repeatedly and alternately stacking two semiconductor layers which have a film thickness of 0.25 λ/n and have different refractive indexes. As a specific example, the upper DBR 36 is configured by repeatedly and alternately stacking a p-type low refractive index layer made of $Al_{0.90}Ga_{0.1}As$ and a p-type high refractive index layer made of $Al_{0.2}Ga_{0.8}As$. In some cases, an emission surface protective layer, which protects a light emission surface, is provided on the upper DBR 36.

The current blocking region 22 (separation portion) is provided between the light emitting unit 12 and the light amplification unit 14 (i.e., between the mesa M1 and the mesa M2), and electrically separates the light emitting unit 12 and the light amplification unit 14. As illustrated in FIG. 2B, the current blocking region 22 is a high resistance region formed by implanting, for example, H+ (proton) ions in the upper DBR 36 over the oxide confinement layer 38 from upper surfaces of the mesas M1 and M2. The current blocking region 22 according to the present exemplary embodiment inhibits crosstalk of current between the light emitting unit 12 and the light amplification unit 14. The method of forming the current blocking region 22 is not limited to the ion implantation. For example, the current blocking region 22 may be formed by forming a groove in the upper DBR 36 over the oxide confinement layer 38 from the upper surfaces of the mesas M1 and M2.

As illustrated in FIG. 2B, the p-side electrode 16 is formed on the light emitting unit 12. The p-side electrodes 18 and 20 are not illustrated. The reason is that the line A-A' runs along a region in which no p-side electrodes 18 and 20 of the mesa M2 are formed, as illustrated in FIG. 2A. As described below, the region in which no p-side electrodes 18 and 20 of the mesa M2 are formed is configured as a light emission surface 44 of the light emitting element 10 according to the present exemplary embodiment.

The cross-sectional view taken along line B-B' in FIG. 2A is a cross-sectional view of a region including the mesas M1 and M2. Therefore, the cross-sectional view illustrated in FIG. 2C is a cross-sectional view substantially identical to the cross-sectional view illustrated in FIG. 2B. As illustrated in FIG. 1B, the electrode 18 and the electrode 20 are formed to partially overlap the mesa M2, and no electrodes 18 and 20 are formed at the central portion of the mesa M2. Therefore, the electrode 20, which is not illustrated in FIG. 2B, is illustrated in FIG. 2C. In addition, during a process of manufacturing the light emitting element array 100, the oxidized region 38b of the oxide confinement layer 38 is formed by forming the mesas M1 and M2 and then oxidizing the mesas M1 and M2 from the periphery, and as a result, the oxidized region 38b, which is formed at the periphery of the light amplification unit 14 (mesa M2), is illustrated.

Line C-C' in FIG. 2A does not run along neither the mesa M1 nor the mesa M2. Therefore, FIG. 2D illustrates a cross-sectional view at the periphery of the mesas M1 and M2 where the mesas M1 and M2 are not formed. Hereinafter, in some cases, a region of the periphery of the mesas M1 and M2 where the mesas M1 and M2 are not formed (i.e., a region where an uppermost layer of the semiconductor layer is the lower DBR 32) is referred to as a "bottom portion". In the light emitting element array 100 according to the present exemplary embodiment, during the manufacturing process thereof, an epitaxial layer, which includes the lower DBR 32, the active region 34, and the upper DBR 36, is formed, and then the mesas M1 and M2 are formed by performing etching up to the lower DBR 32, and as a result, a layer above the lower DBR 32 is not illustrated in FIG. 2D. While FIG. 2D illustrates the p-side electrode 16 and the electrode 20, the p-side electrode in this region need not contact with the semiconductor layer, and as a result, an insulating film 42 is formed between the electrodes 16 and 20 and the lower DBR 32. For example, the insulating film 42 is formed by using a silicon nitride film (SiN film).

Figure 3A:
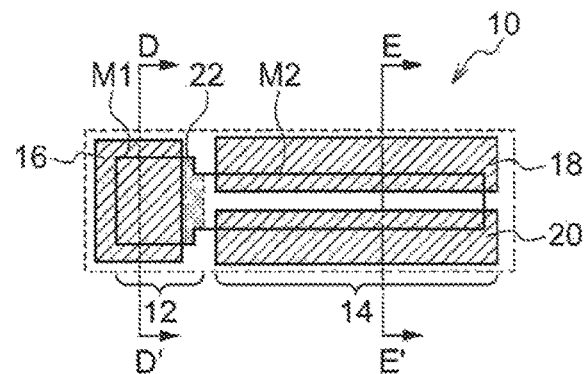
FIG. 3A is a top plan view illustrating an exemplary configuration of the light emitting element according to the first exemplary embodiment.
Figure 3B:
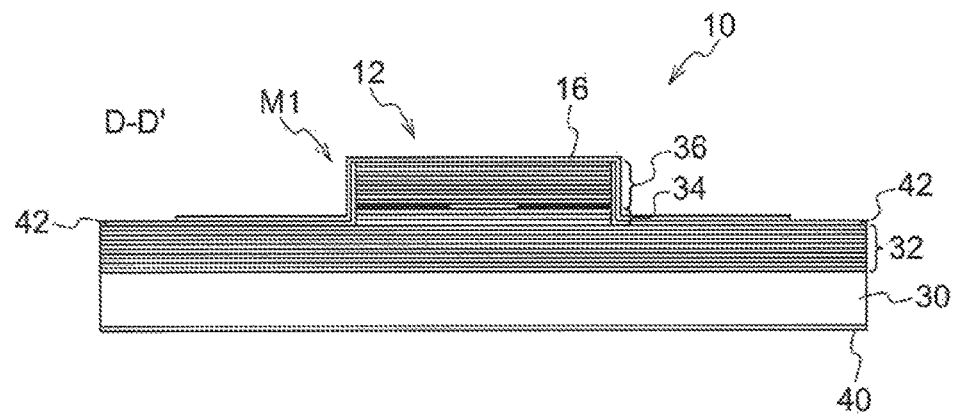
FIGS. 3B and 3C are cross-sectional views each illustrating an exemplary configuration of a portion of the light emitting element according to the first exemplary embodiment.
Figure 3C:
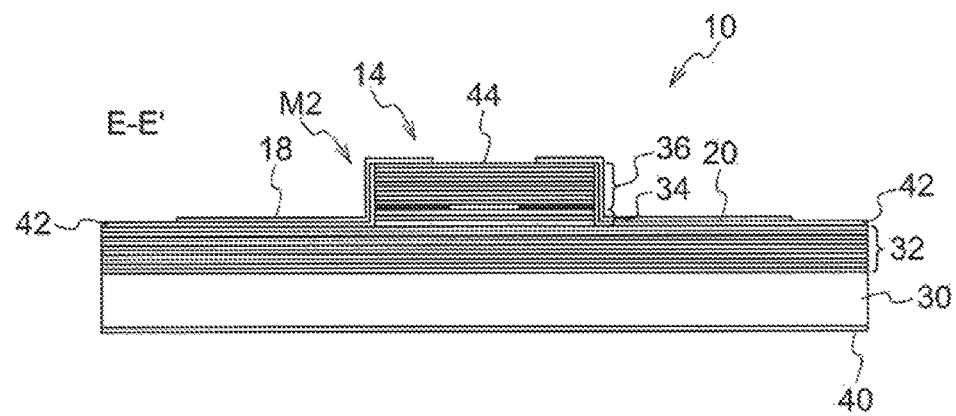

FIG. 3 illustrate cross-sectional views taken along a direction that intersects the line A-A' and the like in FIG. 2A. Specifically, FIG. 3A is a top plan view identical to FIG. 1B, FIG. 3B is a cross-sectional view taken along line D-D' in FIG. 3A, and FIG. 3C is a cross-sectional view taken along line E-E' in FIG. 3B.

FIG. 3B illustrates a cross-sectional view of a region including the light emitting unit 12 (mesa M1), in which the back electrode 40, the substrate 30, the lower DBR 32, the active region 34, the upper DBR 36, and the p-side electrode 16 are illustrated. As illustrated in FIG. 3B, the electrode 16 is formed from an upper surface to a lateral surface of the mesa M1, and over the bottom portion of the mesa M1. The electrode 16 according to the present exemplary embodiment covers the entire upper surface of the mesa M1, and the insulating films 42 are formed between the electrode 16 and the bottom portion of the mesa M1 and between the electrode 16 and the lateral surface of the mesa M1.

FIG. 3C illustrates a cross-sectional view of a region including the light amplification unit 14 (mesa M2), in which the back electrode 40, the substrate 30, the lower DBR 32, the active region 34, the upper DBR 36, and the p-side electrodes 18 and 20 are illustrated. As illustrated in FIG. 3B, the electrodes 18 and 20 are formed from an upper surface to a lateral surface of the mesa M2, and over the bottom portion of the mesa M2. Each of the electrodes 18 and 20 according to the present exemplary embodiment covers a part of the upper surface of the mesa M2, and the insulating films 42 are formed between the electrodes 18 and 20 and the bottom portion of the mesa M2 and between the electrodes 18 and 20 and the lateral surface of the mesa M2. Further, a gap between the electrode 18 and the electrode 20 serves as the light emission surface 44.

Figure 4:
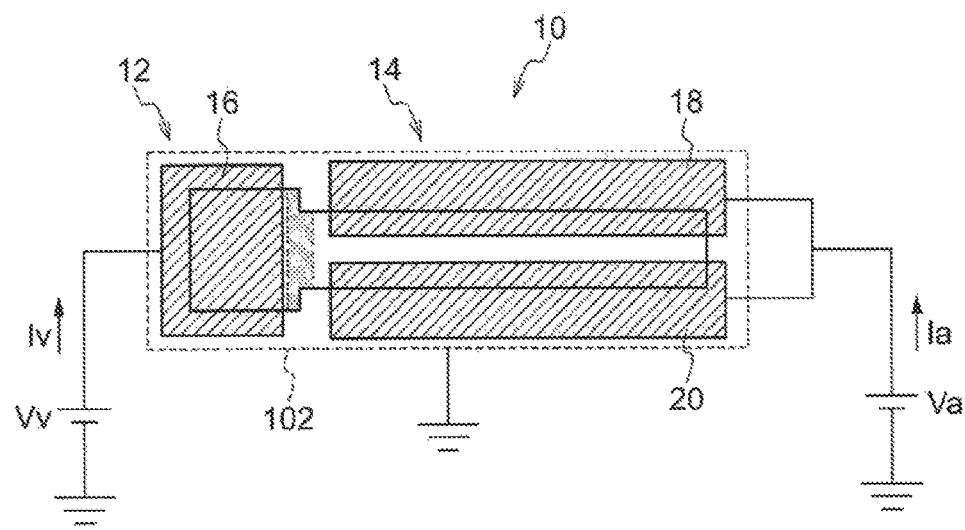
FIG. 4 is a view illustrating an exemplary driving circuit of the light emitting element according to the first exemplary embodiment.

Next, a method of supplying power to the light emitting element 10 (method of operating the light emitting element 10) will be described with reference to FIG. 4. FIG. 4 illustrates a driving circuit of the unit light emitting element 10, but when operating the light emitting element array 100, each of the light emitting elements 10 illustrated in FIG. 1A (or each of a predetermined group of light emitting elements 10) is operated by the driving circuit illustrated in FIG. 4.

As illustrated in FIG. 4, the substrate 102 of the light emitting element 10 is connected to the ground through the back electrode 40 (see FIGS. 2A to 3C). A power source Vv, which operates the light emitting unit 12, is connected to the electrode 16 of the light emitting unit 12, and electric power is supplied to the light emitting unit 12 by applying a driving current Iv between the electrode 16 and the back electrode 40. Meanwhile, a power source Va, which operates the light amplification unit 14, is connected to the electrodes 18 and 20 of the light amplification unit 14, and electric power is supplied to the light amplification unit 14 by applying a driving current Ia between the electrodes 18 and 20 and the back electrode 40.

Figure 5:
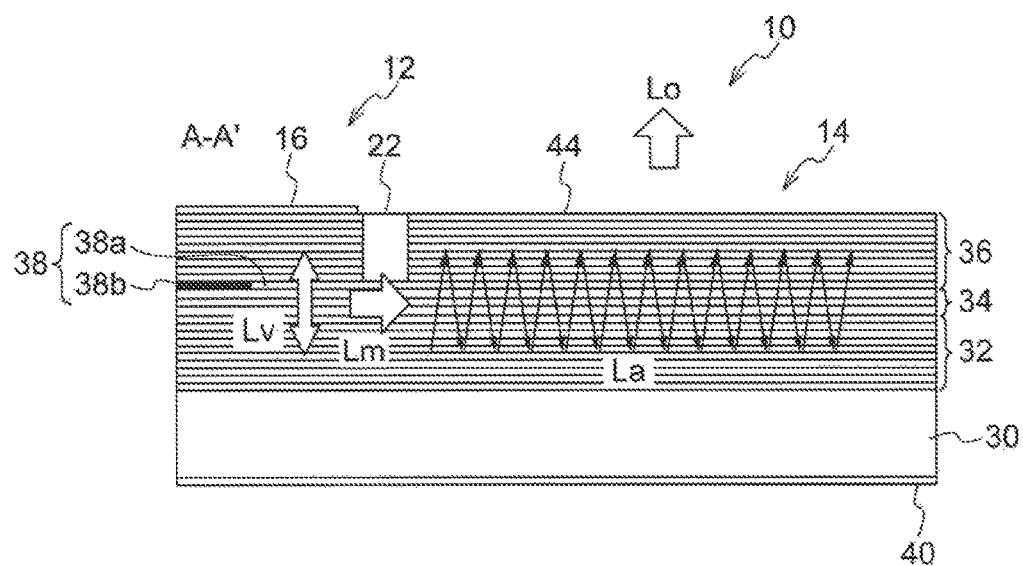
FIG. 5 is a cross-sectional view for explaining the generation of light of the light emitting element according to the first exemplary embodiment.

Next, an operation of the light emitting element 10 according to the present exemplary embodiment will be described with reference to FIG. 5. FIG. 5 illustrates a cross-sectional view of the light emitting element 10 when viewed from the same position as FIG. 2B.

As described above, the light emitting unit 12 according to the present exemplary embodiment is configured with the VCSEL. A typical VCSEL is configured to have a pair of distributed Bragg reflectors (corresponding to the lower DBR 32 and the upper DBR 36) provided on the semiconductor substrate (corresponding to the substrate 102), and an active region (corresponding to the active region 34 including the active layer, the lower spacer layer, and the upper spacer layer) provided between the pair of distributed Bragg reflectors. Further, the VCSEL is configured such that a current is applied to the active layer by the electrodes (corresponding to the p-side electrode 16 and the n-side back electrode 40) provided at opposite sides of the distributed Bragg reflector, and laser oscillation occurs perpendicular to a surface of the substrate such that the oscillating light is emitted from an upper portion of the element.

Even in the light emitting element 10 according to the present exemplary embodiment, oscillating light Lv is generated between the lower DBR 32 and the upper DBR 36 by applying the driving current Iv (see FIG. 4) between the electrode 16 and the back electrode 40. It should be noted that light is not directly emitted from the light emitting unit 12 according to the present exemplary embodiment. The upper surface of the light emitting unit 12 is covered by the electrode 16. For this reason, the oscillating light Lv is reflected by the electrode 16. That is, the electrode 16 according to the present exemplary embodiment also serves as a light blocking unit that blocks light so as to prevent the oscillating light Lv of the light emitting unit 12 from being radiated to the outside.

As illustrated in FIG. 5, a part of the oscillating light Lv leaks in a direction along the substrate surface of the substrate 30 (i.e., a direction parallel to the substrate 30, in other words, a direction orthogonal to a direction in which the respective layers of the light emitting element 10 are stacked), becomes leaking light Lm, and leaks toward the light amplification unit 14. The leaking light Lm moves in a direction that intersects the oscillation direction, and becomes the state of so-called slow light. The leaking light Lm propagates and is amplified in the longitudinal direction (extension direction) of the light emitting element 10 in the light amplification unit 14 while being repeatedly reflected between the lower DBR 32 and the upper DBR 36 of the light amplification unit 14, thereby generating amplified light La. A part of the amplified light La becomes emission light Lo, and is emitted from the light emission surface 44.

As described above, in the light emitting element 10 according to the present exemplary embodiment, the electrode 16 covers a surface corresponding to a light emission region of the light emitting unit 12, and as a result, the light emitted by the light emitting unit 12 efficiently leaks to the light amplification unit 14. In addition, the leaking light Lm, which leaks to the light amplification unit 14, is the slow light, and the leaking light Lm passes through the active region 34 several times by being repeatedly reflected between the lower DBR 32 and the upper DBR 36, and as a result, the leaking light Lm is efficiently amplified in the light amplification unit 14.

By the way, the VCSEL extracts a laser output in a direction perpendicular to the substrate, and the VCSELs are easily configured as an array by two-dimensional integration, and as a result, the VCSEL is used as each light source of the image forming apparatus or a light source for optical communication. Meanwhile, for example, in the image forming apparatus, when configuring a fixing device which fixes toner attached to a recording medium (e.g., a recording sheet, a film, or fabric and hereinafter, referred to as a "recording sheet"), or when configuring a drier which dries ink attached to a recording sheet, it is necessary to linearly condense emission light from the VCSEL array, in some cases.

Figure 9A:
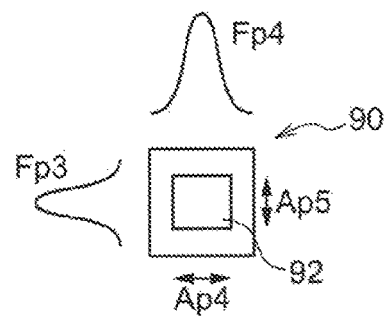
FIGS. 9A and 9B are views for explaining an FFP of a light emitting element according to a comparative example.
Figure 9B:
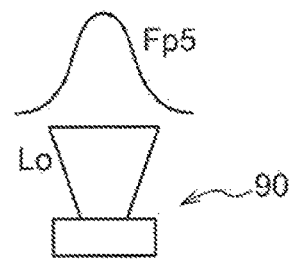
Figure 9C:
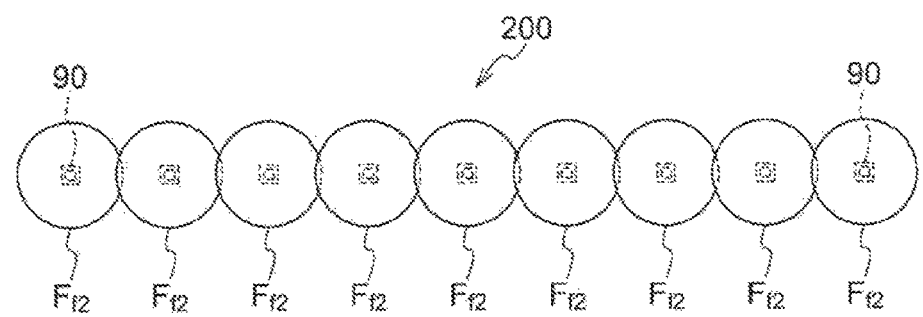
FIG. 9C is a view for explaining an FFP profile of the light emitting element array according to the comparative example.
Figure 10:
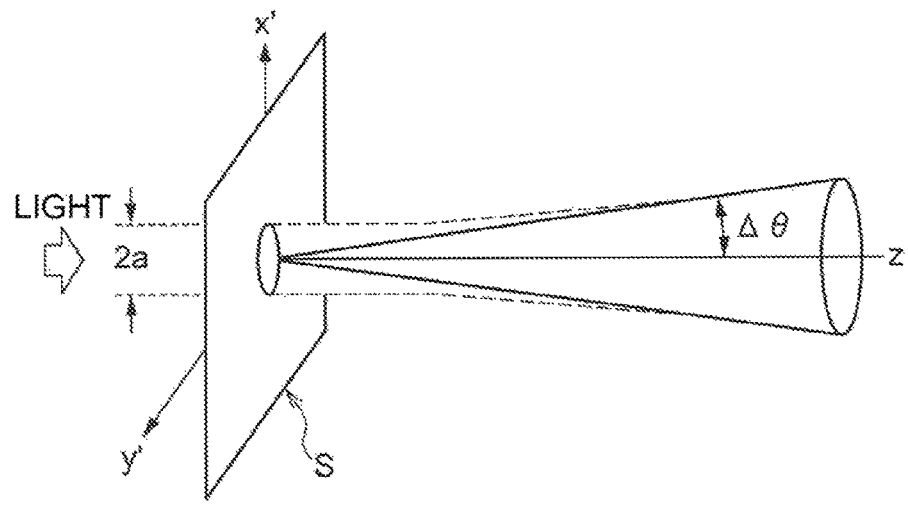
FIG. 10 is a view for explaining a relationship between a spot diameter and a spread angle at the FFP.
Figure 11:
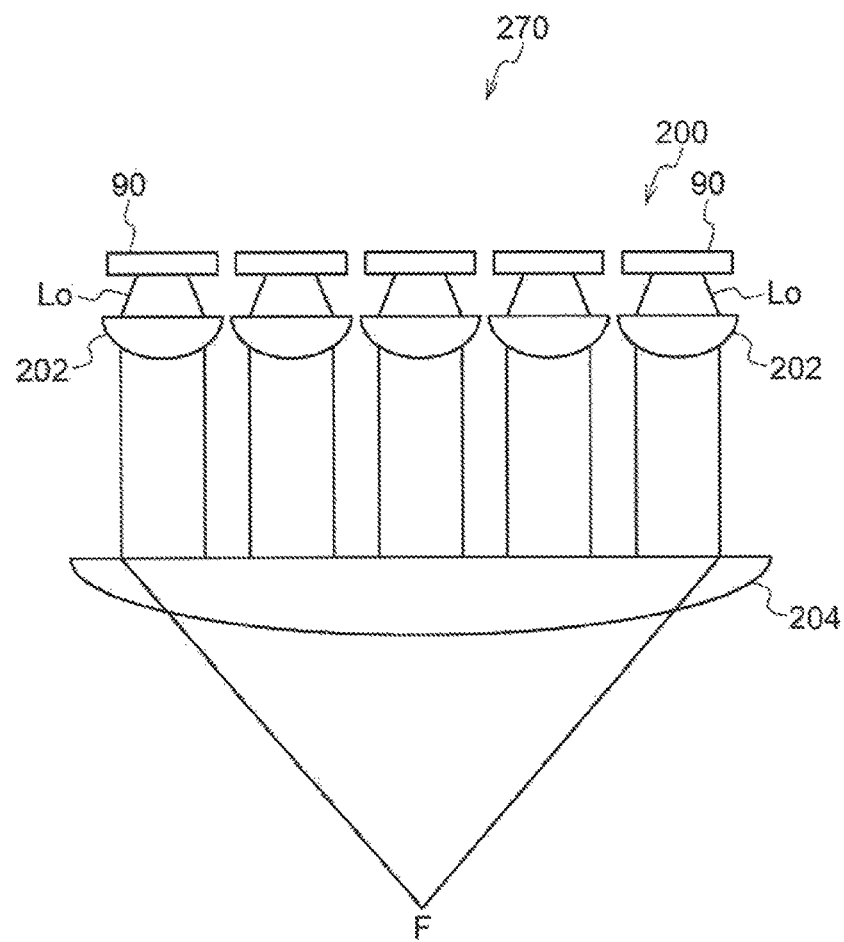
FIG. 11 is a cross-sectional view illustrating an optical device according to the comparative example.

Light condensation using a light emitting element array 200 according to a comparative example in which light emitting elements 90 (VCSEL) are disposed in an array shape will be described with reference to FIGS. 9A to 11. FIG. 9A illustrates a top plan view of the light emitting element 90, FIG. 9B illustrates a side view of the light emitting element 90, and FIG. 9C illustrates a top plan view of an FFP profile of the light emitting element array 200. FIG. 10 is a view for explaining a relationship between a spot diameter of emission light of the light emitting element 90 and a spread angle of the emission light. FIG. 11 illustrates an optical device 270 which is provided with light condensing lenses in the light emitting element array 200 to linearly condense the emission light emitted from the light emitting element array 200.

As illustrated in FIG. 9A, the light emitting element 90 has a light emission region 92 that has an emission opening in a lateral direction of a drawing sheet which has a length of Ap4, and an emission opening in a longitudinal direction of the drawing sheet which has a length of Ap5, and light is emitted from the light emission region 92. In the light emitting element 90 according to the comparative example, both of the lengths Ap4 and Ap5 of the emission openings are generally about 10 µm, and as a result, spread angles of Fp3 and Fp4, which are far field patterns (FFPs) in the directions of the emission openings, are about 10° in view of a full width at half maximum (FWHM).

For this reason, as illustrated in FIG. 9B, a spread angle of Fp5, which is an FFP of emission light Lo from the light emitting element 90, is increased.

Here, a relationship between the spot diameter and the spread angle of light will be described with reference to FIG. 10. FIG. 10 illustrates a state where the emission light spreads in a case where light with a wavelength λ enters an aperture S having a circular opening having a diameter 2a from a −Z direction to a +Z direction. In this case, a spread angle Δθ of the emission light is defined by the following Equation 1.

$$\Delta\theta = 1.22 \times (\lambda/2a) \qquad \text{(Equation 1)}$$

Considering the circular opening having the diameter 2a as the light emission region of the light emitting element, the circular opening may be regarded as a spot diameter of the emission light from the light emitting element. In this case, from Equation 1, the spread angle Δθ depends on the spot diameter 2a such that the spread angle is increased when the spot diameter 2a is decreased, and the spread angle is decreased when the spot diameter 2a is increased. On the above principle, the spread angle is comparatively increased to 10° in the light emitting element 90 of which the emission opening is comparatively small, that is, 10 µm.

FIG. 9C illustrates an FFP profile of the light emitting element array 200 in which the light emitting elements 90 having the FFP are integrated. It should be noted that the substrate of the light emitting element array 200 is omitted from FIGS. 9A to 9C. As illustrated in FIG. 9C, the FFP profile of the light emitting element array 200 becomes a cluster of $F_{f2}$ which is the FFP of each of the approximately circular light emitting elements 90. That is, light emitted from the light emitting element array 200 spreads isotropically.

FIG. 11 illustrates the optical device 270 which is configured by using the light emitting element array 200, and forms a condensed light beam F by linearly condensing light. It should be noted that in FIG. 11, the condensed light beam F extends from a front side of the drawing sheet in a depth direction. As illustrated in FIG. 11, in the optical device 270, since the FFP of the emission light Lo of the light emitting element 90 is isotropic, a light condensing optical system having a two-stage configuration including lenses 202 and a lens 204 is required. That is, in the optical device 270, the emission light Lo from each of the light emitting elements 90 becomes parallel light (collimated light) first by the plural (five in FIG. 11) lenses 202 provided corresponding to the respective light emitting elements 90, and thereafter, the light is condensed by the lens 204. As described above, the light condensing optical system having the two-stage configuration is required in order to configure the optical device 270 by using the light emitting element array 200 in which the light emitting elements 90 in accordance with the comparative example are configured as an array.

Meanwhile, for example, in order to provide a laser beam source of the fixing device, it is necessary to mount light emitting element arrays 200, each having several tens to several hundreds of light emitting points, on a sub-mounts in units of several thousands. However, it is very difficult to dispose the individual lenses with an accuracy of on the order of micrometers to correspond to the individual light emitting elements 90 (VCSEL) arranged minutely as described above, and to uniformly convert the emission light from the light emitting element array 200 into the parallel light, and the optical system also becomes complicated.

Therefore, in the exemplary embodiment of the present invention, the light emitting element array configured with light emitting elements in each of which a light emitting unit and a light amplification unit are integrated is used as the light emitting element (VCSEL) array. Thus, since the light emitted from the light emitting element array is linearly condensed by a single lens having power (light-gathering power) in only one direction, the optical system is simplified, and for example, the fixing device or the drier is reduced in size.

Figure 6A:
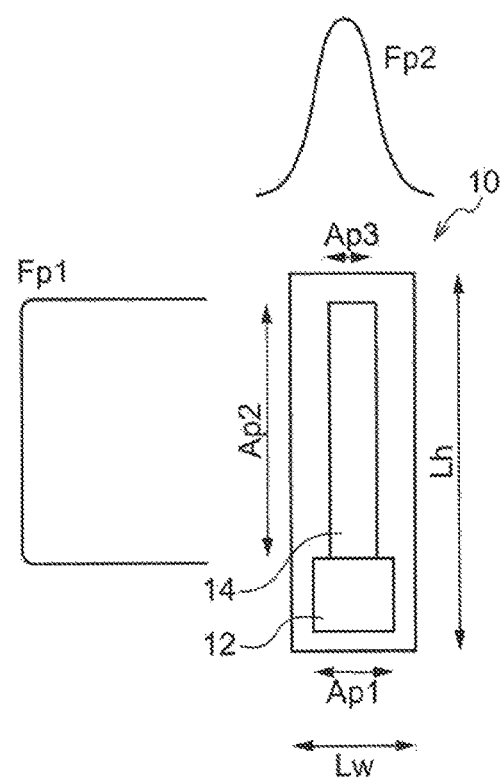
FIGS. 6A and 6B are a top plan view for explaining a far field pattern (FFP) of the light emitting element according to the first exemplary embodiment, and a top plan view illustrating an FFP profile of the light emitting element array according to the first exemplary embodiment, respectively.
Figure 6B:
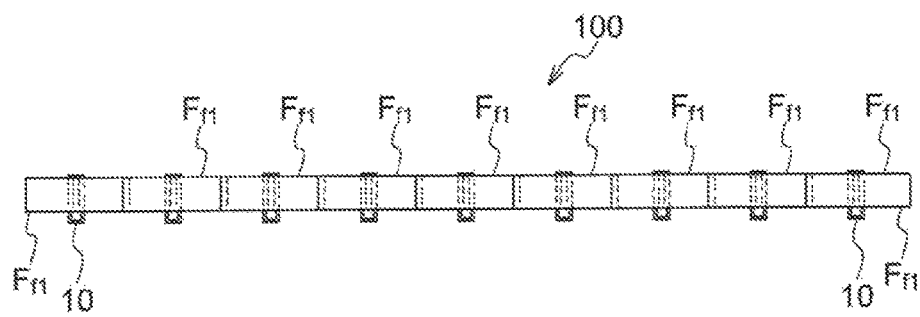

An operation of the light emitting element 10 according to the present exemplary embodiment will be described with reference to FIGS. 6A and 6B. FIG. 6A is a top plan view of the light emitting element 10 for explaining an FFP, and FIG. 6B is a top plan view illustrating an FFP profile of the light emitting element array 100.

The light emitting element 10 having an occupying region in which a length in a drawing sheet lateral direction (transverse direction) is Lw, and a length in a vertical direction (longitudinal direction) is Lh. That is, in a case where the light emitting elements 10 are configured as an array, the light emitting elements 10 are arranged with an arrangement pitch of Lw or Lh. Hereinafter, for convenience, the lengths Lw and Lh are referred to as a chip size. In the present exemplary embodiment, the chip size is not particularly limited, but for example, the length Lh may be about 1 mm to 10 mm, and the length LW may be about 0.6 mm to 2 mm. In the present exemplary embodiment, for example, Lh is set to about 10 mm, and Lw is set to about 1.2 mm.

Because the light emitting unit 12 of the light emitting element 10 does not actually emit light, there is no concept of an emission opening, but the a length Ap1, which corresponds to the emission opening of the light emitting unit 12, is set to several micrometers to be substantially the same as the light emitting element 90 according to the comparative example.

Meanwhile, as illustrated in FIG. 6A, the light amplification unit 14 of the light emitting element 10 includes a light emission region having an emission opening in the transverse direction which has a length of Ap3, and an emission opening in the longitudinal direction which has a length of Ap2, and light is emitted from the light emission region. Further, in the light amplification unit 14, the length Ap3 is several micrometers to be substantially the same as that in the light emitting element 90 according to the comparative example. However, the length Ap2 is set to, for example, 1 mm, which is very long even in comparison with a length corresponding to the light emission region of the light emitting unit 12. For this reason, a spread angle of Fp2, which is the FFP in the transverse direction of the light emitting element 10, is about 10°, which is substantially the same as that of the light emitting element 90 according to the comparative example, but a spread angle of Fp1, which is the FFP in the longitudinal direction, is about 0.02°, which is very small.

FIG. 6B illustrates an FFP profile of the light emitting element array 100 in which the light emitting elements 10 having the FFP as described above are integrated. As illustrated in FIG. 6B, the FFP of each of the light emitting elements 10 becomes $F_{f1}$ which is the FFP having a substantially rectangular shape elongated in the transverse direction of which the length in the longitudinal direction is substantially equal to Ap2. Therefore, the FFP profile of the light emitting element array 100 becomes a profile in which $F_{f1}$, which is the FFP of the light emitting element 10, is arranged in the transverse direction. The length in the longitudinal direction of the FFP profile of the light emitting element array 100 hardly depends on a distance from the light emitting element array 100, but is constant as approximately Ap2. That is, the emission light from the light emitting element array 100 becomes parallel (collimated) to the longitudinal direction, thereby forming linear light having a constant width. Therefore, according to the light emitting element array 100, since the emission light has already been collimated in one direction in the step of the light emitting element 10, the light condensing optical system for the emission light is simplified.

Second Exemplary Embodiment

Figure 7:
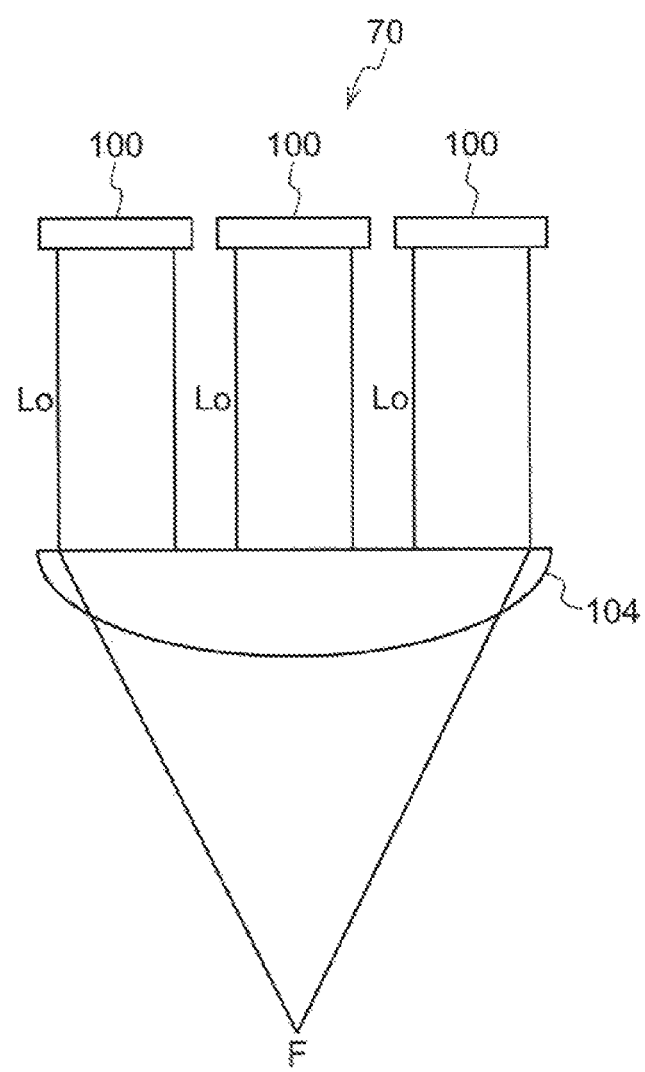
FIG. 7 is a cross-sectional view illustrating an exemplary optical device according to a second exemplary embodiment.

An optical device according to the present exemplary embodiment will be described with reference to FIG. 7. FIG. 7 illustrates an optical device 70 using the light emitting element array 100. In FIG. 7, three light emitting element arrays 100 illustrated in FIG. 1A are disposed such that the longitudinal direction of the light emitting element 10 becomes a right and left direction of the drawing sheet. For this reason, the number of condensed light beams F is three, and the condensed light beams F linearly extend from a front side of the drawing sheet in a depth direction.

As described above, since the emission light Lo emitted from each of the light emitting element arrays 100 is substantially parallel light, only a single lens 104, which is a cylindrical (semi-cylindrical) lens having power in the right and left direction of the drawing sheet, may be used as the lens which constitutes the light condensing optical system. For this reason, with the optical device 70 according to the present exemplary embodiment, the light condensing optical system is simplified, and the apparatus is reduced in size in comparison with a case where the light emitting element array in which only the light emitting elements are configured as an array is used.

Third Exemplary Embodiment

Figure 8A:
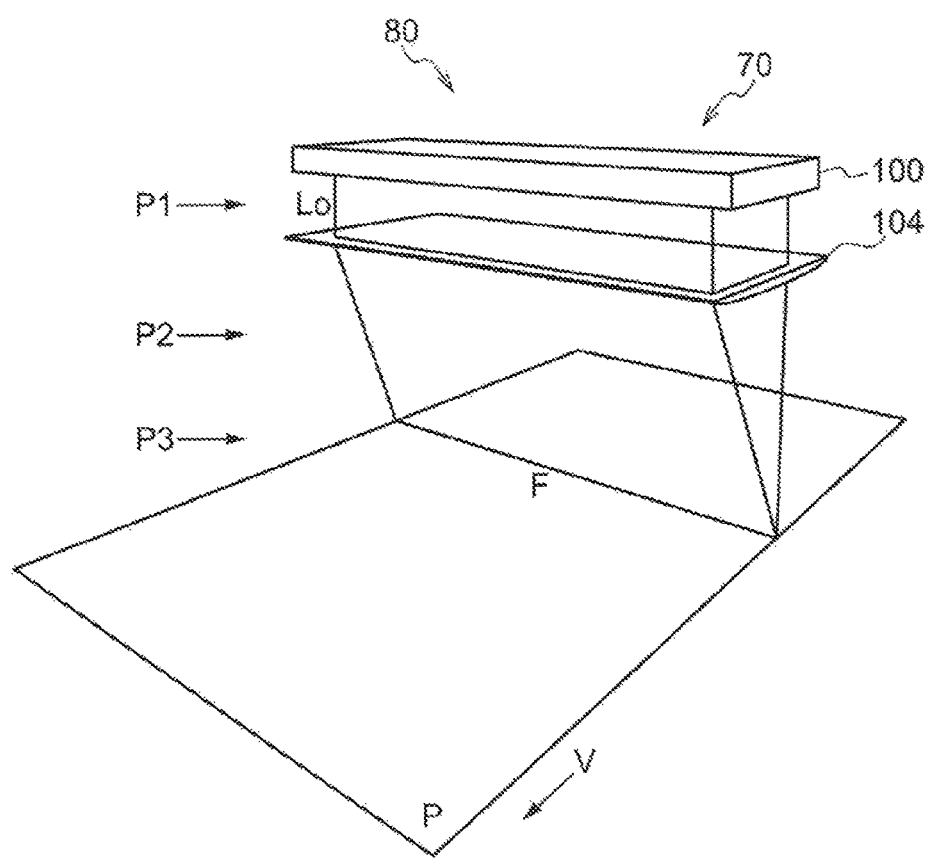
FIG. 8A is a perspective view illustrating an exemplary configuration of a fixing device according to a third exemplary embodiment.

A fixing device according to the present exemplary embodiment will be described with reference to FIGS. 8A to 8D. As an example, the fixing device according to the present exemplary embodiment is a part that is provided in an image forming apparatus, and fixes toner by emitting laser beams to a recording sheet to which the toner is attached. FIG. 8A illustrates a fixing device 80 using the optical device 70, and an FFP profile of emission light from the fixing device 80. The fixing device 80 emits laser beams by condensed light beams F from the optical device 70 while transporting a recording sheet P, to which toner (not illustrated) is attached, in a transport direction V, and fixes the toner onto the recording sheet P.

As illustrated in FIG. 8A, the optical device 70, which constitutes the fixing device 80, has the light emitting element array 100 and the semi-cylindrical lens 104 which are identical to that in FIG. 7. It should be noted that the fixing device 80 has a single light emitting element array 100 and that the respective light emitting elements 10, which constitute the light emitting element array 100, are disposed in a longitudinal direction which is the transport direction V.

Figure 8B:
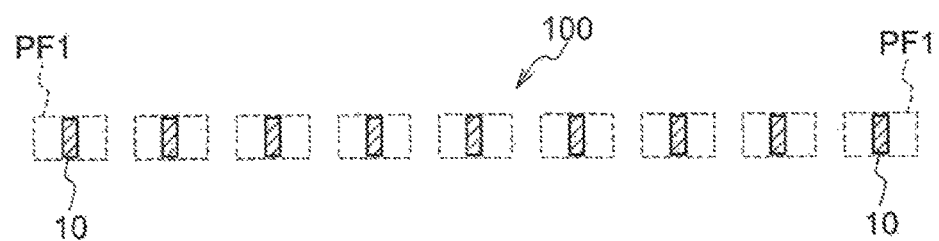
FIGS. 8B to 8D are top plan views illustrating FFP profiles at respective positions of a light condensing optical system according to the third exemplary embodiment, respectively.
Figure 8C:
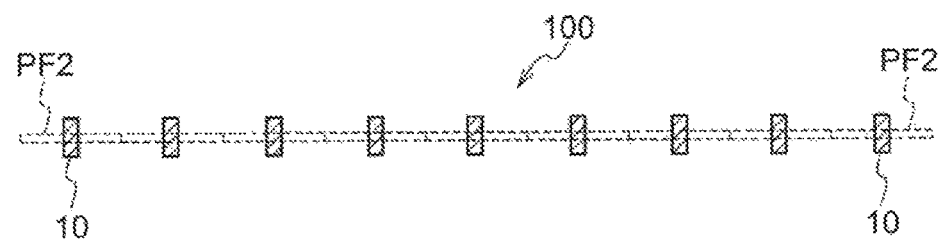
Figure 8D:
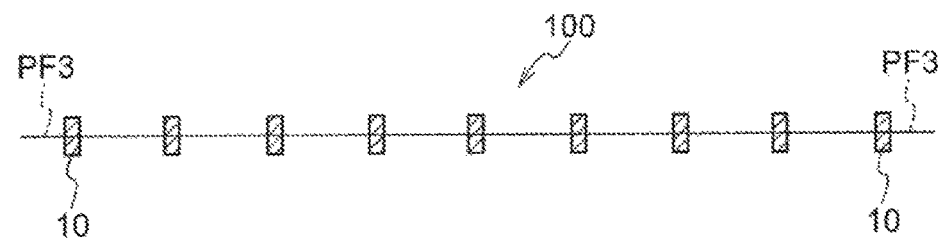

FIG. 8B illustrates a profile PF1 of the emission light Lo from the light emitting element array 100 when viewed from a position P1 illustrated in FIG. 8A, that is, a position between the light emitting element array 100 and the lens 104, FIG. 8C illustrates a profile PF2 of the emission light Lo from the light emitting element array 100 when viewed from a position P2, that is, a position between the lens 104 and the recording sheet P, and FIG. 8D illustrates a profile PF3 of the emission light Lo from the light emitting element array 100 when viewed from a position P3, that is, a position in the vicinity of a position of the condensed light beam F. As illustrated in FIGS. 8B and 8C, the emission light Lo from the light emitting element array 100 becomes the condensed light beam F via the respective profiles PF1, PF2, and PF3. As an example, a width of the condensed light beam F is several hundreds of micrometers.

As described above, according to the image forming apparatus having the fixing device 80 according to the present exemplary embodiment, the light condensing optical system is simplified, and the apparatus is reduced in size in comparison with a case where the light emitting element array in which only the light emitting elements are configured as an array is used.

In the respective exemplary embodiments, the light emitting element array 100 in which the light emitting elements 10 are integrated on the substrate in a monolithic manner has been described as an example, but the present invention is not limited thereto, and the light emitting element array may be configured by arranging unit light emitting elements 10.

In the respective exemplary embodiments, a configuration in which the mesa M1, which constitutes the light emitting unit 12, and the mesa M2, which constitutes the light amplification unit 14, are formed by performing etching up to the upper surface of the lower DBR 32 has been described as an example, but the present invention is not limited thereto, and for example, the mesas may be formed by performing etching up to the upper surface of the substrate 30.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A light emitting element array comprising:
    a plurality of semiconductor stacked structures each including
        a light emitting unit that is formed on a substrate, and
        a light amplification unit that
            extends from the light emitting unit along a substrate surface of the substrate to have a length in an extension direction which is longer than that of the light emitting unit,
            amplifies light propagating in the extension direction from the light emitting unit, and
            emits the amplified light from a light emission portion formed along the extension direction,
    wherein the plurality of semiconductor stacked structures are arranged such that the extension directions of the respective light amplification units are substantially parallel to each other.

2. The light emitting element array according to claim 1, wherein each of the plurality of light emitting units includes a light blocking unit that blocks light to prevent the light emitted from the light emitting unit from being radiated to an outside.

3. The light emitting element array according to claim 2, further comprising:
    a first polarity side electrode, wherein
    the substrate includes
        a first principal surface on which the plurality of semiconductor stacked structures are stacked, and
        a second principal surface on which the first polarity side electrode is formed,
    each light emitting units includes a second polarity side electrode that serves as the light blocking unit, and
    each light amplification unit includes two second polarity side electrodes which are disposed along the substrate surface and which have a gap therebetween constituting the light emission portion along the substrate surface.

4. The light emitting element array according to claim 1, wherein
    each semiconductor stacked structure further includes a separation portion that is formed between the light emitting unit and the light amplification unit to electrically separate the light emitting unit and the light amplification unit.

5. The light emitting element array according to claim 1, wherein the plurality of semiconductor stacked structures are arranged such that emission lights emitted from the light emission portions overlap each other.

6. The light emitting element array according to claim 5, wherein the plurality of semiconductor stacked structures are arranged such that the emission lights overlap each other on an object to be irradiated.

7. An optical device comprising:
    a light emitting element array including
        a plurality of semiconductor stacked structures each including
            a light emitting unit that is formed on a substrate, and
            a light amplification unit that
                extends from the light emitting unit along a substrate surface of the substrate to have a length in an extension direction which is longer than that of the light emitting unit,
                amplifies light propagating in the extension direction from the light emitting unit, and
                emits the amplified light from a light emission portion formed along the extension direction,
        the plurality of semiconductor stacked structures being arranged such that the extension directions of the respective light amplification units are substantially parallel to each other; and
    a condensing lens that linearly condenses the light emitted from the light emitting element array in a direction that intersects the extension direction of the light amplification units.

8. The optical device according to claim 7, wherein the condensing lens is a cylindrical lens having light condensing power in the direction that intersects the extension direction.

9. An image forming apparatus comprising:
    a light emitting element array including
        a plurality of semiconductor stacked structures each including
            a light emitting unit that is formed on a substrate, and
            a light amplification unit that
                extends from the light emitting unit along a substrate surface of the substrate to have a length in an extension direction which is longer than that of the light emitting unit,
                amplifies light propagating in the extension direction from the light emitting unit, and
                emits the amplified light from a light emission portion formed along the extension direction,
        the plurality of semiconductor stacked structures being arranged such that the extension directions of the respective light amplification units are substantially parallel to each other;

an image forming unit that forms an image with an image forming material on a recording medium; and
a moving unit that moves at least one of the light emitting element array and the recording medium along the extension direction of the light amplification units such that light is emitted to the image formed on the recording medium from the light emitting element array.

\* \* \* \* \*